United States Patent [19]

Saito et al.

[11] Patent Number: 5,105,383

[45] Date of Patent: Apr. 14, 1992

[54] METHOD FOR DETECTING THE PRESENCE OF BLOCH LINES IN A MAGNETIC WALL

[75] Inventors: Fumihiko Saito, Sagamihara; Takeo Ono, Atsugi; Hitoshi Oda, Yokohama; Kou Yoneda, Machida; Akira Shinmi, Yokohama; Tetsuya Kaneko; Nobuo Watanabe, both of Atsugi, all of Japan

[73] Assignee: Canon Kabushiki Kaisha, Tokyo, Japan

[21] Appl. No.: 602,372

[22] Filed: Oct. 25, 1990

Related U.S. Application Data

[63] Continuation of Ser. No. 98,944, Sep. 21, 1987, abandoned.

[30] Foreign Application Priority Data

Sep. 24, 1986 [JP] Japan ................. 61-226824

[51] Int. Cl.$^5$ ............................................. G11C 19/08
[52] U.S. Cl. ......................................... 365/87; 365/29
[58] Field of Search ...................... 365/29, 87, 10

[56] References Cited

U.S. PATENT DOCUMENTS 3,691,540  9/1972  Almasi et al. ........................ 365/8
4,583,200  4/1986  Konishi et al. ....................... 365/29

FOREIGN PATENT DOCUMENTS

3542279A1  6/1986  Fed. Rep. of Germany ........ 365/29
2574212    6/1986  France .

OTHER PUBLICATIONS

American Institute of Physics Conference Proceedings on Magnetism and Magnetic Materials-No. 29; 1975; pp. 666-667.
IEEE Transactions on Magnetics, vol. MAG-19, No. 5, Sep. 1983; pp. 1841-1843.
"Magnetic Bubble Domain System Using Different Types of Domains", Malozemoff, IBM Technical Disclosure Bulletin, vol. 16, No. 9, Feb. 1974, pp. 3114-3115.

Primary Examiner—Joseph A. Popek
Attorney, Agent, or Firm—Fitzpatrick, Cella, Harper & Scinto

[57] ABSTRACT

In a method or device for detecting the presence and/or absence of a Bloch line in a magnetic wall of a magnetic domain formed in a thin magnetic film, a magnetic field parallel to the plane of the thin magnetic film is applied to the magnetic domain to cause a variation in the magnetic domain, the state of variation of the magnetic domain is detected and the presence and/or absence of a Bloch line in a predetermined position of the magnetic wall is detected according to the result of the detection of the state of variation set forth above.

19 Claims, 5 Drawing Sheets

METHOD FOR DETECTING THE PRESENCE OF BLOCH LINES IN A MAGNETIC WALL

This application is a continuation of application Ser. No. 07/098,944 filed Sept. 21, 1987, now abandoned.

BACKGROUND OF THE INVENTION

1. Field of the Invention

The present invention relates to a method for detecting the presence of Bloch lines in a magnetic wall of a striped magnetic domain formed in a thin magnetic layer, said Bloch line being used as a unit information carrier in a Bloch line memory of a very high density.

2. Related Background Art

Various memory devices, such as magnetic tape, the Winchester disk, floppy disk, optical disk, magneto-optical disk, magnetic bubble memory etc. are being used for external memories of computers, electronic files, image files or the like. All these memory devices, with the exception of magnetic bubble memory, involve a relative movement of a recording medium such as a tape or a disk and a record/reproducing head, and are therefore associated with the problems of tracking, gliding and abrasion between the recording medium and the head, and defocusing in the case of optical or magneto-optical disk, which hinders achievement of a high density in the memory.

On the other hand, the magnetic bubble memory, as disclosed in the U.S. patent application Ser. No. 434,538, which is a continuation of U.S. patent application Ser. No. 801,401, now abandoned, of the same assignee, not involving a mechanical driving mechanism and having a high reliability, has been considered more favorable for achieving a high density in comparison with other memories. However, such magnetic bubble memory utilizes, as the information carrier of 1 bit, a circular magnetic domain or a bubble formed in a magnetic garnet layer having an axis of easy magnetization perpendicular to the plane of said layer, and is therefore associated with a limit of several tens of megabits per chip even when there is employed the minimum bubble (0.3 $\mu$m in diameter) limited simply by the properties of the presently available garnet layer. It is therefore not possible to achieve a high density in the magnetic bubble memory unless an alternative material such as hexaferrite or an amorphous alloy becomes available.

In order to overcome the above-mentioned limit in the recording density of the magnetic bubble memory, attention has recently been attracted to the Bloch line memory. The assignee of the present invention has already disclosed related technologies for this type of memory in U.S. patent application Ser No 660,260, which is a continuation of U.S. patent application Ser. No. 800,770, now abandoned, and U.S. Pat. No. 4,974,201, which issued on Nov. 27, 1990, from U.S. patent application Ser. No. 072,668, filed on July 28, 1987.

The Bloch line memory utilizes, as described in U.S. Pat. No. 4,583,200, in a magnetic wall surrounding a magnetic domain formed in a magnetic garnet film, an area composed of a Neil magnetic wall (hereinafter called a Bloch line, constituting an information carrier of one bit) sandwiched between Bloch magnetic wall structures in which the direction of magnetization in the magnetic wall is twisted into the opposite direction, and is capable of achieving a recording density higher by almost two orders than that in the magnetic bubble memory utilizing the circular magnetic domain, called a bubble, as one bit. For example a garnet film with a bubble diameter of 0.5 $\mu$m can achieve a memory capacity of 1.6 Gbits per chip using the Block line.

Figure 1:
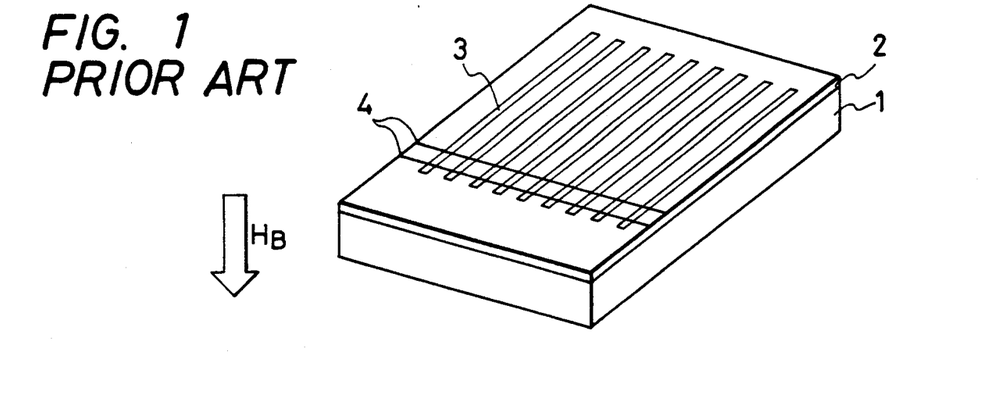
FIG. 1 is a schematic view of a conventional Bloch line memory.

FIG. 1 schematically illustrates a conventional Bloch line memory, wherein are shown a substrate 1 composed of a rare earth garnet such as GGG or NbGG; a magnetic garnet film 2 formed for example by liquid phase epitaxy (LPE) on said substrate 1; stripe-shaped magnetic domains 3; and conductor lines 4 patterned on the magnetic garnet film 2. A bias magnetic field $H_B$ is applied, as indicated by an arrow, to the entire memory. In the magnetic wall of the stripe-shaped magnetic domains 3, information is stored by the presence or absence of a pair of Bloch lines, respectively corresponding to "1" or "0". Each Bloch line pair is present at a stable point, or a potential well, formed in the stripe-shaped magnetic domain 3, and is transferred to an adjacent potential well by the application of a pulse magnetic field perpendicular to the plane of the substrate. In the following there will be explained the method of reading information from the Bloch line memory, or of detecting the presence of Bloch line pairs.

Figure 2A:
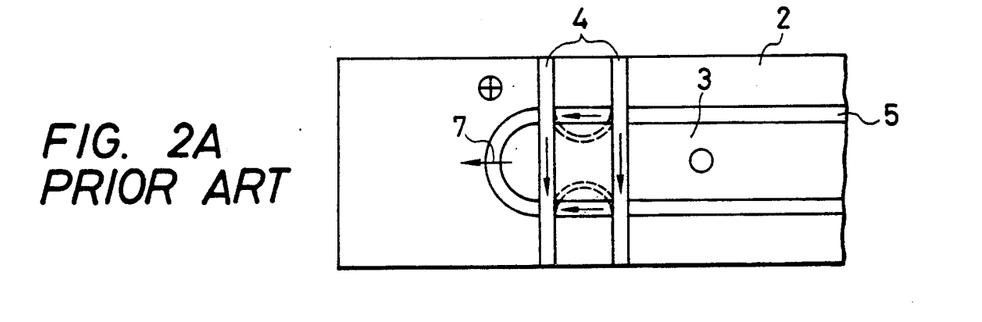
FIGS. 2A to 2C are schematic views showing the conventional method for detecting a Bloch line.
Figure 2B:
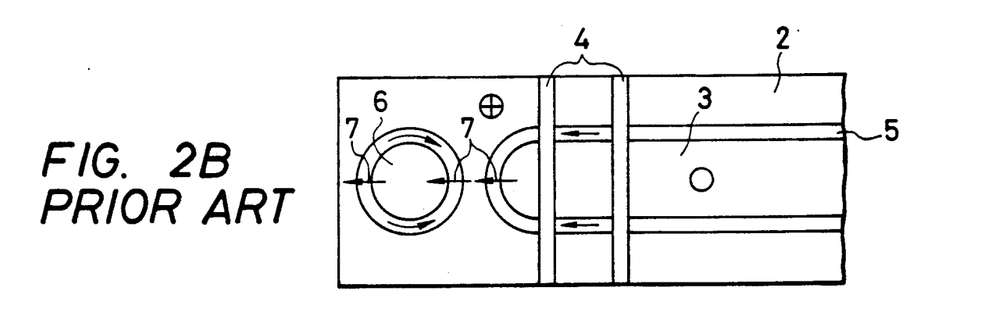
Figure 2C:
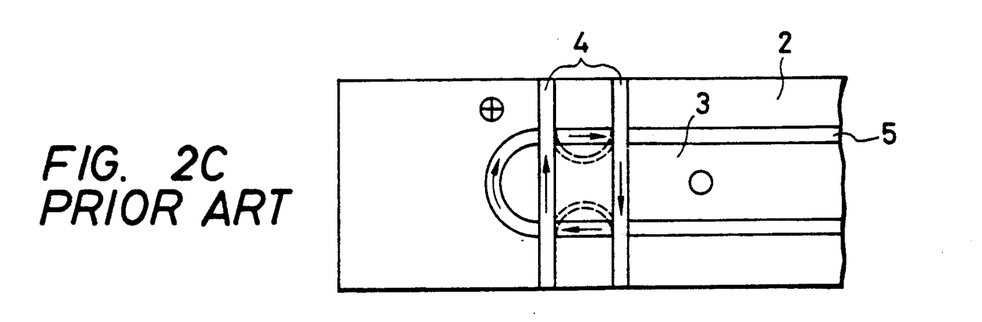

FIGS. 2A to 2C are schematic views showing the conventional Bloch line detecting method, wherein the same components as those in FIG. 1 are represented by the same numbers. Also there are shown a magnetic wall 5; a separated bubble 6; and Bloch lines 7. Arrows in the magnetic wall 5 indicate the direction of magnetization, and arrows in the conductor lines 4 indicate the direction of current.

Referring to FIG. 2A, a stripe-shaped magnetic domain 3 is formed on the magnetic garnet film 2, and a Bloch line 7 is present in the magnetic wall 5. However, the potential well is not illustrated. Across the magnetic domain 3 there are provided two conductor lines 4 in which mutually opposite pulse currents are given as indicated by the arrows. Since the magnetic field formed by the currents in the conductor lines 4 is opposite to the direction of magnetization in the stripe-shaped magnetic domain 3, the magnetic domain positioned between the conductor lines 4 shrinks, to cause a displacement of the magnetic walls 5, as indicated by broken lines. When the currents are further increased, the magnetic walls 5 are mutually united as shown in FIG. 2B whereby the end portion of the magnetic domain 3 is separated as a bubble 6. After the currents are terminated, a Bloch line 7 the same as that present before the separation of the bubble is formed at the end portion of the magnetic domain 3, and said magnetic domain 3 recovers the original size. FIG. 2C shows a case where the Block line is absent. In this state, currents supplied to the conductor lines 4 allow one to move the magnetic walls positioned between the conductor lines 4 in a similar manner as in the presence of Bloch line shown in FIGS. 2A and 2B and said magnetic walls can be mutually united by an increase in the currents. However, in case of FIG. 2A, with the presence of a Bloch line, the directions of magnetization in the magnetic walls positioned between two conductor lines are the same, while in case of FIG. 2C said directions are mutually opposite, so that the interaction of the magnetic walls at said uniting is different in these two cases. More specifically, the current required for uniting the magnetic walls is smaller in the case Bloch line. It is therefore possible to obtain a separated bubble, corresponding to the presence of a Bloch line, by selecting the currents in the conductor lines 4 at such level between a value required for uniting the magnetic walls 5 in the presence of the Bloch line 7 and a value required for uniting said magnetic walls in the absence of the Bloch line, and to detect the presence of a Bloch line 7 by detecting the bubble 6 in the same manner as in the conventional magnetic bubble memory.

However, the conventional method of Bloch line detection explained above requires the separation of the stripe-shaped magnetic domain for each Bloch line detection, requires a complex mechanism, and cannot achieve a high detection speed, because the separated bubble has to be transferred and detected with an external rotating magnetic field or a current drive method. Also, this method requires a high electric power consumption.

SUMMARY OF THE INVENTION

An object of the present invention is to provide a Bloch line detecting method capable of detecting the presence and for absence of a Bloch line in a magnetic wall at a high speed.

Another object of the present invention is to provide a novel Bloch line memory device in which the above-mentioned detecting method is applicable, and a detecting device for executing the above-mentioned detecting method.

The foregoing objects can be achieved, according to the present invention, by a detecting method comprising the step of applying, to a magnetic domain, a magnetic field parallel to the plane of a thin magnetic film in which said magnetic domain is formed, and the step of detecting the state of variation of the magnetic domain resulting from said application of magnetic field to detect the presence of a Bloch line at a predetermined position in the magnetic wall of the magnetic domain.

In an embodiment of the present invention, the detecting method comprises the step of applying a magnetic field parallel to the plane of a thin magnetic film in which a stripe-shaped magnetic domain is formed, in a direction orthogonal to the longitudinal direction of said stripe-shaped magnetic domain, in an area including the end portion of said stripe-shaped magnetic domain, the step of identifying the variation of the magnetic domain in said area resulting from said application of magnetic, field, and the step of detecting the presence and/or absence of a Bloch line at the end portion of the stripe-shaped magnetic domain, from the result of said identification.

Other features and advantages of the method of the present invention, of the Bloch line memory device and the detecting device of the present invention, will become fully apparent from the following description of the preferred embodiments, taken in conjunction with the accompanying drawings.

DETAILED DESCRIPTION OF THE PREFERRED EMBODIMENTS

The Bloch line memory employing the method of the present invention is provided with a conductor pattern for generating an in-plane magnetic field orthogonal to the longitudinal direction of the stripe-shaped magnetic domain, or to the magnetic wall. A current in said conductor pattern applies a predetermined magnetic field to the magnetic wall of said stripe-shaped magnetic domain, thereby adding a gyro force to the magnetic moment of the magnetic wall and thus causing movement thereof. The directions of magnetic moments in the mutually facing magnetic walls close to the end portion of the stripe-shaped magnetic domain vary depending on the presence or absence of a Bloch line in the end portion, thus altering the mode of variation of the shape of said magnetic domain caused by the movement of the magnetic walls.

The present invention is featured by detecting that difference in variation of magnetic domain for example with a magnetic sensor, or with a polarized light beam and a photodetector.

In the following the method of the present invention will be explained in detail.

FIGS. 3A, 3B, 4 and 5A to 5C are schematic views provided for explaining an example of the detecting method of the present invention.

Figure 3A:
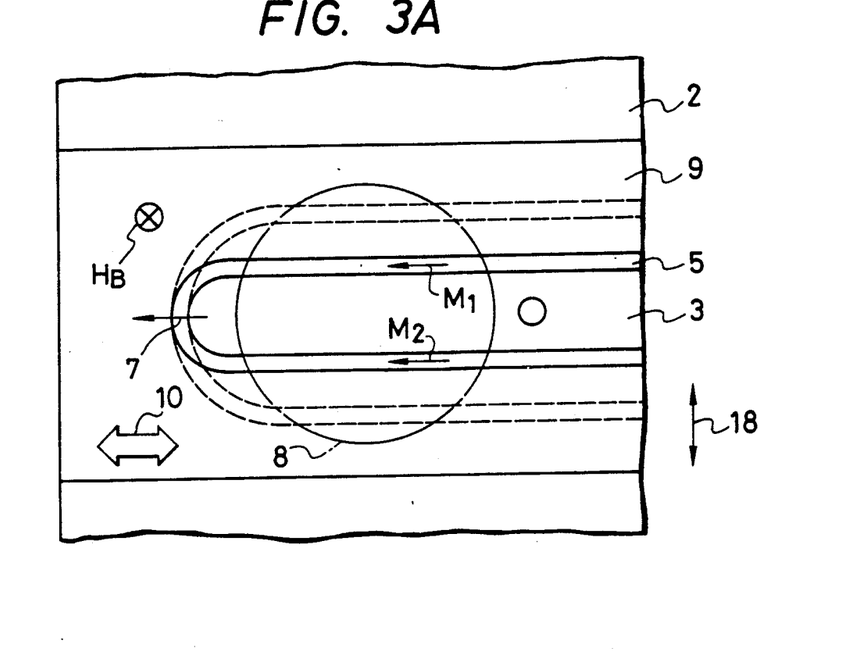
FIGS. 3A and 3B are schematic views showing the method for detecting the presence and/or absence of a Bloch line of the present invention.
Figure 3B:
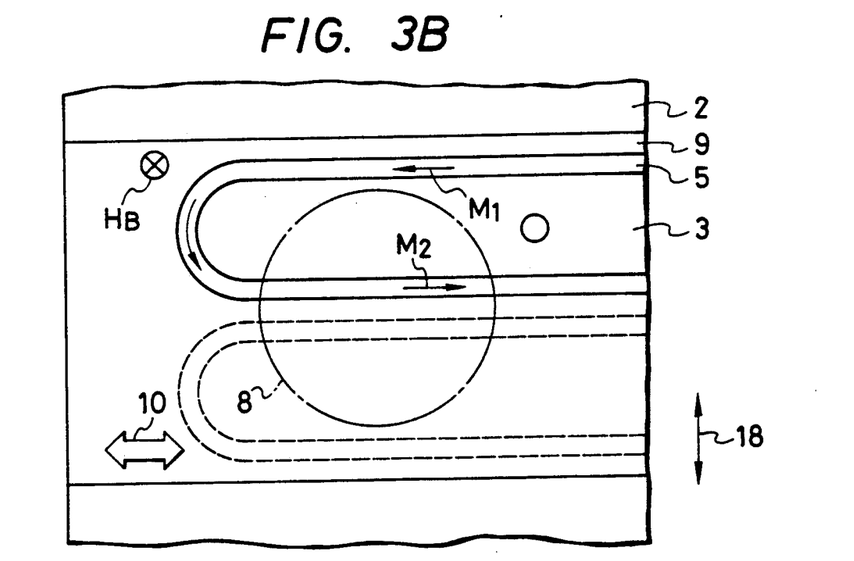
Figure 4:
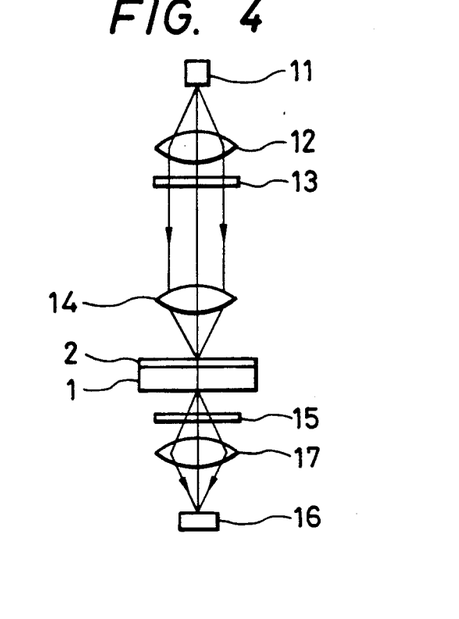
FIG. 4 is a schematic view of an optical system for use in the execution of the method of the present invention.

FIGS. 3A and 3B illustrate the modes of variation of the stripe-shaped magnetic domain at the detection of a Bloch line according to the method of the present invention, while FIG. 4 is a schematic view of an optical system for use in the detection of the Bloch line according to the embodiment shown in FIG. 3, and FIGS. 5A to 5C are charts showing the relationship between the current in the conductor pattern for generating an in-plane magnetic field of the memory and the output of a photodetector.

In FIGS. 3A, 3B and 5A to 5C, numbers 1 to 7 indicate same components as in FIGS. 1 and 2. There are also shown a light spot 8 formed by a light beam on the memory; a conductor line 9; an arrow 10 indicating the direction of current in said conductor line 9; a light-emitting unit 11 such as a semiconductor laser; a collimating lens 12 for converting the light from the light-emitting unit 11 into a parallel beam; a polarizer 13 for converting said parallel beam into a linearly polarized light beam; a condenser lens 14 for concentrating the light at a predetermined position of the stripe-shaped magnetic domain 3 shown in FIGS. 3A and 3B to form the light spot 8; an analyzer 15 for detecting the state of polarization of the polarized light beam; a photodetector 16; and a condenser lens 17 for concentrating the light, coming from the stripe-shaped magnetic domain 3 and transmitted by the analyzer 15, onto the photodetector 16. 18 indicates the direction of the in-plane magnetic field applied to the magnetic wall 5.

Referring to FIGS. 3A and 3B, a magnetic garnet film 2 composed for example of $(YSmLuCa)_3(FeGd$-

)$_5$O$_{12}$ or (YSmLuGd)$_3$(FeGa)$_5$O$_{12}$ is given a vertical bias magnetic field H$_B$ perpendicular to the plane of said magnetic garnet film 2 and directed from above to below the plane of the drawing to form a stripe-shaped magnetic domain 3 in said film 2. FIG. 3A shows a case in which a a Bloch line 7 is present at the end of said magnetic domain 3, so that the magnetic moments in the mutually facing magnetic walls 5 of the magnetic domain close to the end thereof are in the same direction, as indicated by arrows M1, M2. A conductor line 9 composed for example of an ITO film formed on the magnetic garnet film 2 is given a pulse current of a wave form shown in FIG. 5A in a direction 10 to apply a magnetic field represented by an arrow 18 to the magnetic walls 5, whereby the magnetic moments thereof receive a gyro force and the magnetic walls 5 undergo a reciprocating motion between the solid-lined position and the broken-lined position. The light irradiating the stripe-shaped magnetic domain 3 through the optical system shown in FIG. 4 forms the light spot 8 and is transmitted by said magnetic domain 3 with a rotation of the polarization plane by the Faraday effect, so that the photodetector 16 shown in FIG. 4 provides an output as shown in FIG. 5B.

Figure 5A:
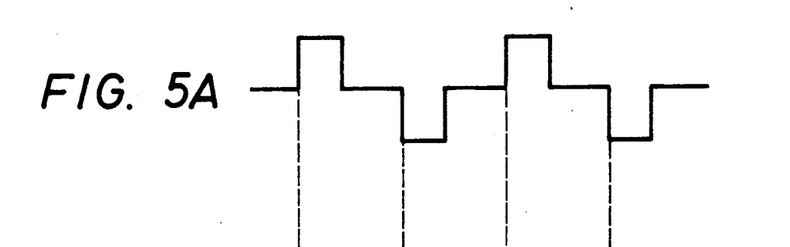
FIGS. 5A to 5C are charts showing the relation between the currents in the conductor patterns of the memory and the output of a photodetector.

On the other hand, FIG. 3B shows a case of absence of Bloch line at the end of the stripe-shaped magnetic domain 3, whereby the magnetic moments of the mutually facing magnetic walls 5 are opposite, or antiparallel, as shown by the arrows M1, M2. A current as shown in FIG. 5A given to the conductor line 9 in the direction 10 applies a magnetic field indicated by an arrow 18 to the magnetic walls 5 as in the case of FIG. 3A, whereby the magnetic moments of said magnetic walls 5 again receive the gyro force and the wall 5, undergo a reciprocating motion between the solid-lined position and the broken-lined position. However, the mode of motion of the magnetic walls 5 in this state is different from that in the case of FIG. 3A when a Bloch line is present at the end portion of the domain, so that the photodetector 16 provides an output as shown in FIG. 5C upon receiving the transmitted and polarized light beam.

Figure 5B:
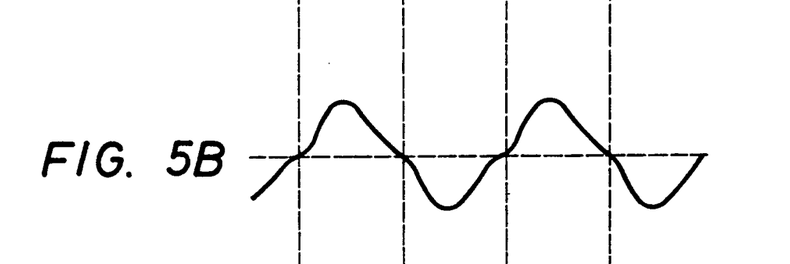
Figure 5C:
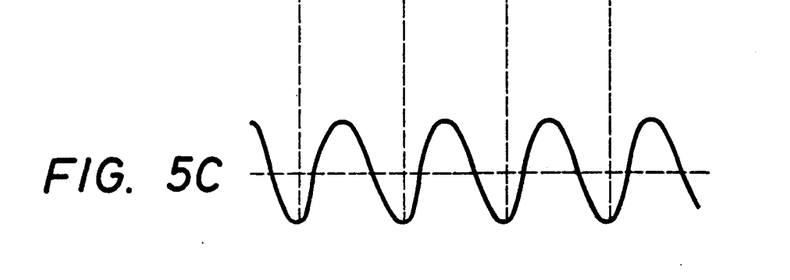

The signal shown in FIG. 5C has a doubled frequency compared with the signal in FIG. 5B, and the presence or absence of a Bloch line at the end of the stripe-shaped magnetic domain 3 can therefore be detected as a difference in the output signal of the photodetector 16. More specifically, in the present embodiment, the presence or absence of Bloch line is made to correspond to a difference in the frequency of the output signal of the photodetector 16, and a high-speed detection is thus made possible.

In summary, the method of the present embodiment, for detecting the presence of a Bloch line at the end of a stripe-shaped magnetic domain 3 comprises steps of:

(A) forming a stripe-shaped magnetic domain in a thin magnetic film composed of a magnetic garnet film;
(B) forming a Bloch line, as an information carrier, in the magnetic wall 5 of said magnetic domain 3;
(C) transferring said Bloch line in the magnetic wall 5 by Bloch line transfer means not shown;
(D) terminating the transfer of the Bloch line and supplying an AC current to a conductor line 9, for generating an in-plane magnetic field, formed on the magnetic garnet film 2;
(E) applying an alternating in-plane magnetic field, generated by the conductor line 9, to the magnetic walls 5 of the stripe-shaped magnetic domain 3 perpendicular to said magnetic walls and in parallel manner to the plane of the magnetic film, thereby causing oscillating motion of the magnetic walls 5 in the vicinity of the end portion of the magnetic domain 3;
(F) forming a light beam linearly polarized in a predetermined direction by a polarizer 13 and concentrating said light beam in the magnetic domain 3 in the vicinity of the end portion thereof, thereby illuminating a predetermined area (including the light spot 8 shown in FIGS. 3A and 3B) of the stripe-shaped magnetic domain 3;
(G) detecting the light beam transmitted by the magnetic domain 3, with a photodetector 16 through an analyzer 15;
(H) detecting the state of the output signal of photodetector 16, for example with an unrepresented frequency analyzer; and
(I) identifying the presence or absence of a Bloch line at the end of the stripe-shaped magnetic domain 3 according to the result of said detection.

The method of the present embodiment detects the presence of a Bloch line through successive steps (A) to (I) mentioned above. It will be evident that the steps (D), (E) and (F) may be interchanged without any problem. Also, the steps (F) to (H) are representative steps for optical detection of Bloch line and may be replaced by other steps for obtaining a signal corresponding to the presence or absence of a Bloch line, as will be explained in the following embodiments.

FIGS. 6A to 6F illustrate various patterns of the conductor line 9 shown in FIG. 3.

The application of the in-plane magnetic field to the magnetic walls 5 of the stripe-shaped magnetic domain 3 shown in FIG. 3 depends not only on the wave form of the current in the conductor line 9 but also on the pattern of said conductor line 9.

Consequently, the movements of the magnetic walls 5 on both sides of the magnetic domain 3 can be controlled by selecting the pattern of the conductor line 9 and the wave form of the current therein in suitable manner.

In FIGS. 6A to 6F, the same components as those, in the foregoing embodiment are represented by the same numbers.

Figure 6A:
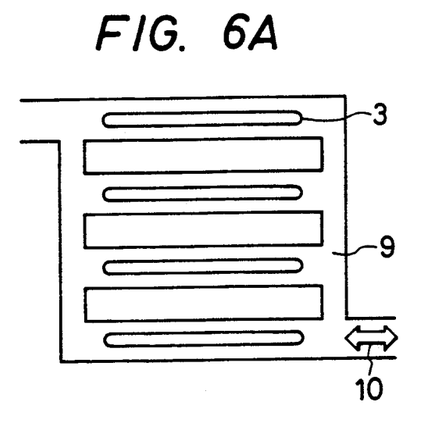
FIGS. 6A to 6F are schematic views showing other embodiments of the conductor patterns to be formed on the memory.
Figure 6B:
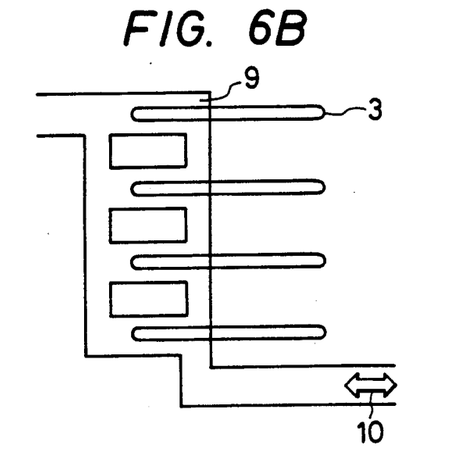
Figure 6C:
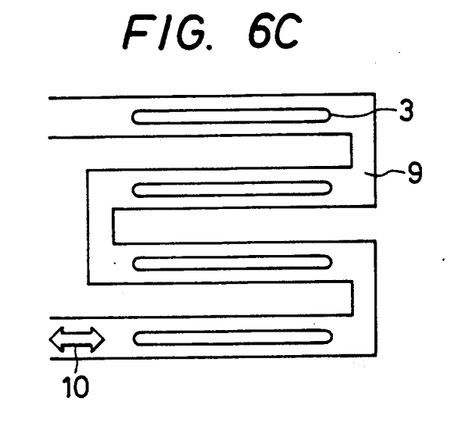
Figure 6D:
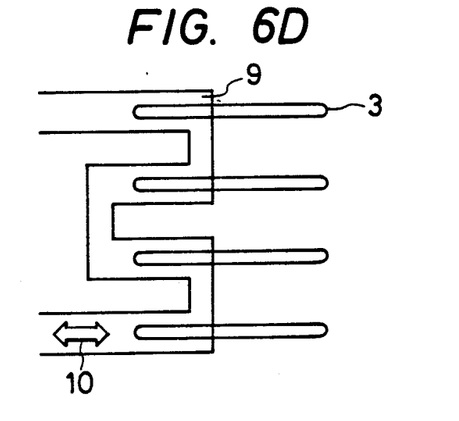
Figure 6E:
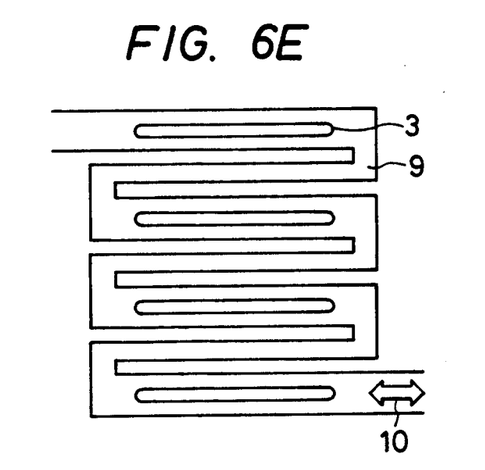
Figure 6F:
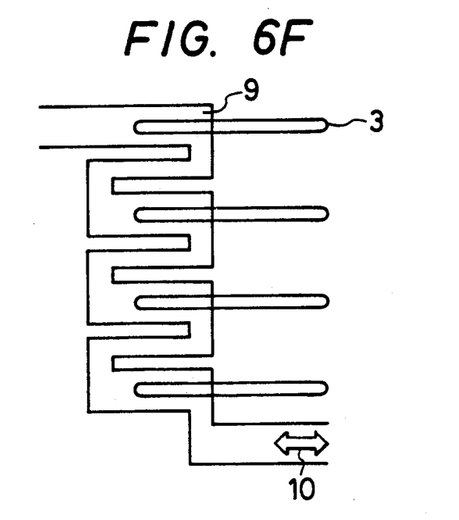

A pattern shown in FIG. 6A applies magnetic fields of a same direction over the entire of all the magnetic domains 3. A pattern shown in FIG. 6B applies magnetic fields of a same direction to a part, for example an end portion, of each of the magnetic domains 3. A pattern in FIG. 6C applies magnetic fields of opposite direction alternately to the magnetic domains 3, and the intensity of the in-plane magnetic field is larger than in the case of FIG. 6A if the current 10 is same. A pattern in FIG. 6D applies magnetic fields of alternate directions to a part of each of the magnetic domains 3, and the intensity of the magnetic field is larger than in the case of FIG. 6B if the current 10 is same. A pattern in FIG. 6E applies magnetic fields of the same direction to the entirety of all of the magnetic domains 3, and the intensity of the magnetic field is larger than in the case of FIG. 6A if the current 10 is same. A pattern in FIG. 6F applies magnetic fields of the same direction to a part of each of the magnetic domains 3, and the intensity of the magnetic field is larger than in the case of FIG. 6B if the current 10 is same.

Also, the patterns shown in FIGS. 6A to 6F may be suitably combined to obtain a conductor line of a desired pattern.

In the foregoing embodiment, the method for forming Bloch lines in the magnetic wall of the stripe-shaped magnetic domain, and the method for transferring the Bloch lines in the magnetic wall have not been explained in detail, since these methods were already disclosed in U.S. Pat. No. 4,583,200.

Figure 7:
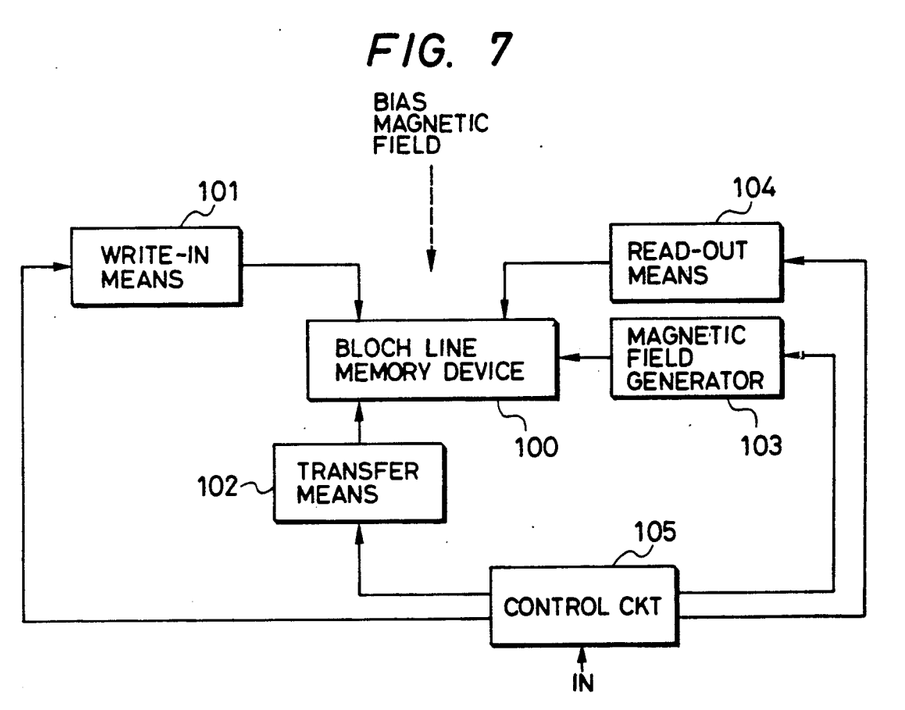
FIG. 7 is a block diagram showing an example of a detecting device for executing the method of the present invention.

FIG. 7 is a block diagram showing an example of the detecting device for executing the method of the present invention. Said device can be utilized as an information reproducing device, for reproducing information from a memory device utilizing Bloch lines as the information carriers.

In FIG. 7, a Bloch line memory device 100 has plural stripe-shaped magnetic domains formed, as shown in FIG. 1, in a thin magnetic film formed in turn on a substrate, and is provided with conductor lines as shown in FIG. 3 or FIGS. 6A to 6F.

Write-in means 101 forms Bloch lines in the magnetic walls of plural magnetic domains according to the input information to be recorded.

Said input information is digital information consisting of "1's" and "0's", which are converted into the presence and absence of Bloch lines, by said write-in means 101. Thus, the Bloch lines are present at predetermined potential wells in the magnetic wall.

Transfer means 102 transfers the Bloch lines along the magnetic wall, for example by applying an in-plane rotating magnetic field to the memory device 100.

As already explained in the foregoing embodiment, the stripe-shaped magnetic domains are stably formed in the thin magnetic film, by the application of a bias magnetic field perpendicular to said magnetic film, as represented by a broken-lined arrow in FIG. 7.

As explained before, the structure and function of the write-in means 101 and the transfer means 102 shown in FIG. 7, and the positioning of Bloch lines with the potential wells are disclosed in U.S. Pat. No. 4,583,200.

A magnetic field generator 103, for generating a magnetic field parallel to the plane of the thin magnetic film to be used in the detecting method of the present invention, is composed of means for supplying the conductor line, formed on the thin magnetic film of the memory device 100 for generating an in-plane magnetic field, with an AC current composed of predetermined pulses. For improving the precision of detection, said means provides a sinusoidal or rectangular AC current of a frequency of 1 MHz or higher.

It is also possible to directly apply, to the stripe-shaped magnetic domains of the memory device 100, an in-plane magnetic field for detecting the presence of Bloch lines, from the outside by said magnetic field generator 103.

Read-out means 104 including for example an optical system as shown in FIG. 4 serves to detect the presence of a Bloch line at the end of the stripe-shaped magnetic domain and generates a corresponding detection signal.

In the case that said read-out means 104 is composed of optical means as explained in the foregoing embodiments, the substrate, thin magnetic film and conductor line constituting the memory device are composed of materials transparent to the light to be used.

Said read-out means is, however, not limited to such optical means but can be any means capable of detecting the variation in the magnetic walls or in the magnetic domain when an in-plane magnetic field is applied to the magnetic domain by the magnetic field generator 103. An example of such means is a magnetic sensor, such as an already-known magnetic resistance element.

In a case where said read-out means 104 is composed of optical means as shown in FIG. 4, there can be advantageously employed a scanner for deflecting the light in a predetermined direction, or a light source array provided with plural light-emitting elements.

Such scanner or light source array enables high-speed detection of Bloch lines, by simultaneous or successive irradiation of the detecting positions (position of the light spot 8 in FIG. 3) of the plural stripe-shaped magnetic domains of the memory device 100. There may be employed one or plural photodetectors suitably according to the driving method of said scanner or light source array and to the structure of the optical system.

Again referring to FIG. 7, a control circuit 105 controls various means 101, 102, 104 and the generator 103 according to the input signal IN.

In the detection of Bloch lines by the readout means 104, it functions in synchronization with the magnetic field generator 103 and the transfer means 102 according to the instructions from the control circuit 105.

Each Bloch line, stored in a potential well in the magnetic wall of the stripe-shaped magnetic domain of the memory device 100, is transferred in succession to a neighboring potential well, so that the information represented by the presence or absence of the Bloch line is transferred to the end portion of the magnetic domain where the Bloch line is detected.

In synchronization with the positioning of said Bloch line or said information at the end portion of the magnetic domain, the magnetic field generator 103 applies an in-plane magnetic field perpendicular to each magnetic wall of the magnetic domains. The read-out means 104 successively detects the state of magnetic field in an area of the magnetic domain in the vicinity of the end portion thereof, influenced by said magnetic field application, and identifies the presence or absence of the Bloch line at the end portion of the magnetic domain, thereby releasing time-sequential signals corresponding to the presence or absence of Bloch lines.

It is therefore rendered possible, in the detection of Bloch lines, to dispense with a step of conversion into a bubble. Also, the direction detection of the Bloch line without the bubble transfer enables high-speed detection and allows one to simplify the structure of the memory device.

It is thus possible to reproduce information at a high speed from a Bloch line memory device utilizing Bloch lines as the information carriers, and to reproduce a large amount of information within a short time from a memory of a large capacity.

The optical Bloch line detection in the foregoing embodiments utilizes a polarized light beam transmitted by the stripe-shaped magnetic domain 3. However, it is also possible to compose the conductor line with a reflective metal such as Al, Au or Cu, to introduce a polarized light beam to the garnet film 2 through the substrate 1, and to detect the light reflected by said conductor line 9, thereby identifying the presence or absence of a Bloch line.

What is claimed is:

1. A method for detecting the presence and/or absence of a Bloch line in a magnetic wall of a stripe magnetic domain formed in a thin magnetic film, comprising the steps of:

applying, to the magnetic domain, an in-plane magnetic field in a direction substantially perpendicular to a longitudinal direction of the magnetic domain, to cause a variation in the shape of the magnetic domain; and detecting the presence and/or absence of a Bloch line in a predetermined position of the magnetic wall, by detecting the variation of the magnetic domain.

2. A detecting method according to claim 1, wherein said in-plane magnetic field consists of an AC magnetic field.

3. A detecting method according to claim 2, wherein said detecting means comprises the steps of:

irradiating a predetermined area of the magnetic domain with a polarized light beam, said area being a varying portion of a geometric shape thereof by said applying step; and photoelectrically converting said polarized light beam into an electric signal after passing through said area and through an analyzer, the presence and/or absence of said Bloch line being detected on the basis of the electric signal.

4. A detecting method according to claim 3, wherein said area is in the vicinity of an end portion of the magnetic domain and said predetermined area is at the end portion.

5. A detecting device for detecting the presence and/or absence of a Bloch line in a magnetic wall of a stripe magnetic domain formed in a thin magnetic film, said device comprising:

a magnetic field generator for applying, to the magnetic domain, an in-plane AC magnetic field in a direction substantially perpendicular to a longitudinal direction of the magnetic domain, to cause a variation in the shape of the magnetic domain; and a sensor for sensing the variation of the magnetic domain to detect the presence and/or absence of a Bloch line in a predetermined position in the magnetic wall of the magnetic domain.

6. A detecting device according to claim 5, further comprising transfer means for transferring the Bloch line along the magnetic wall.

7. A detecting device according to claim 6, further comprising control means for supplying instruction signals to said magnetic field generator, means, detecting and transfer means for causing synchronized operations of these three means.

8. A detecting device according to claim 5, wherein said predetermined position is at an end portion of the magnetic domain.

9. A detecting device according to claim 8, wherein said sensor comprises:

means for irradiating an area in the vicinity of the end portion of the magnetic domain with a polarized light beam, said area being a varying portion of a geometric shape thereof by said in-plane AC magnetic field; and a photodetector for photoelectrically converting said polarized light beam into a signal after passing through said area and through an analyzer, the state of variation in the magnetic domain being detected on the basis of the signal from the photodetector.

10. A detecting device according to claim 5, 6, 7, 8 or 9, wherein said magnetic field generator comprises a conductor line formed on the thin magnetic film and supplied with a current.

11. A Bloch line memory utilizing, as information carriers, Bloch lines formed in a magnetic wall of a magnetic domain formed in a thin magnetic film, said memory comprising:

a substrate;

a thin magnetic film formed on said substrate and provided with a stripe magnetic domain to store Bloch lines in a magnetic wall of said stripe magnetic domain; and a conductor line pattern, formed on the thin magnetic film, having the longitudinal direction of the pattern substantially consistent with that of said magnetic domain, by supplying the pattern with a current to apply an in-plane AC magnetic field to said magnetic domain in a direction substantially perpendicular to the longitudinal direction, causing a variation in the shape of said magnetic domain, wherein the presence and/or absence of a Bloch line at a predetermined position in a magnetic wall of said magnetic domain is determined by detecting the variation in said magnetic domain.

12. A bloch line memory according to claim 11, wherein said predetermined position is at an end portion of said magnetic domain.

13. A method for detecting the presence and/or absence of a Bloch line in a magnetic wall of a stripe magnetic domain formed in a magnetic film, comprising the steps of:

applying to the magnetic film, an in-plane magnetic field in a direction substantially perpendicular to a longitudinal direction of the magnetic domain; and detecting the presence and/or absence of the Bloch line on the basis of the variation of the shape of the magnetic domain by said applying step.

14. A method for detecting the presence and/or absence of a Bloch line in a magnetic wall of an end portion of a stripe magnetic domain formed in a magnetic film, comprising the steps of:

applying, to an area in the vicinity of the end portion of the magnetic film, an in-plane AC magnetic field in a direction substantially perpendicular to a longitudinal direction of the magnetic domain; and detecting the presence and/or absence of the Bloch line on the basis of the variation of the shape of the magnetic domain by said applying step.

15. A detecting method according to claim 14, wherein said detecting step comprises steps of irradiating polarized light having greater size than a width of the magnetic domain when the in-plane AC magnetic field is not applied to an area being in the vicinity of the end portion, and detecting the polarized light from the area in the vicinity of the end portion obtained by said irradiating step through an analyzer so that the Bloch line is detected on the basis of the variation of the intensity of the polarized light detected through the analyzer.

16. A method for detecting the presence and/or absence of a Bloch line in a magnetic wall of an end portion of a stripe magnetic domain formed in a magnetic film, comprising the steps of:

applying, to an area being in the vicinity of the end portion of the magnetic film, and in-plane AC magnetic field in a direction substantially perpendicular to a longitudinal direction of the magnetic domain; and discriminating the presence and/or absence of the Bloch line on the basis of the variation of the shape of the magnetic domain, said step discriminating the presence of the Bloch line by detecting the variation of the width of the magnetic domain and the absence of the Bloch line by detecting an oscillating motion of the magnetic domain in the width direction of the magnetic domain.

17. A detecting method according to claim 16, wherein said discriminating step comprises the steps of irradiating polarized light having greater size than a width of the magnetic domain when the in-plane AC magnetic field is not applied to an area in the vicinity of the end portion, and detecting the polarized light from the area in the vicinity of the end portion obtained by said irradiating step through an analyzer so that the Bloch line is discriminated on the basis of the variation of the intensity of the polarized light detected through the analyzer.

18. A memory device utilizing, as information carriers, bloch lines in a magnetic wall of a stripe magnetic domain formed in a magnetic film, comprising:
write-in means for writing the Bloch lines in the magnetic wall;
means for transferring the Bloch lines along the magnetic wall; and
read-out means for reading out the Bloch lines, said read-out means comprising a magnetic field generator for applying, to the magnetic film, an in-plane magnetic field in a direction substantially perpendicular to a longitudinal direction of the magnetic domain, and a detector for detecting the presence and/or absence of the Bloch lines on the basis of the variation of the shape of the magnetic domain by said magnetic field generator.

19. A memory device utilizing, as information carriers, Bloch lines in a magnetic wall of a stripe magnetic domain formed in a magnetic film, comprising:
write-in means for writing the Bloch lines in the magnetic wall;
means for transferring the Bloch lines along the magnetic wall; and
read-out means for reading out the Bloch lines, said read-out means comprising a magnetic field generator for applying, to an area in the vicinity of the end portion of the magnetic domain of the magnetic film, an inplane AC magnetic field in a direction substantially perpendicular to a longitudinal direction of the magnetic domain, and a detector for detecting the presence and/or absence of the Bloch lines at the end portion of the magnetic domain on the basis of the variation of the shape of the magnetic domain by said magnetic field generator.

* * * * *

UNITED STATES PATENT AND TRADEMARK OFFICE
CERTIFICATE OF CORRECTION

PATENT NO. : 5,105,383
DATED : April 14, 1992
INVENTOR(S) : FUMIHIKO SAITO ET AL.

It is certified that error appears in the above-identified patent and that said Letters Patent is hereby corrected as shown below:

COLUMN 1

Line 18, "memory" should read --memory,--.
Line 26, "of optical" should read --of the optical--.

COLUMN 2

Line 53, "Block" should read --Bloch--.

COLUMN 3

Line 47, "magnetic," should read --magnetic--.

COLUMN 5

Line 26, "line" should read --lines--.
Line 34, "wall 5," should read --wall 5--.

COLUMN 6

Line 45, "those," should read --those--.
Line 49, "entire" should read --entirety--.

UNITED STATES PATENT AND TRADEMARK OFFICE
CERTIFICATE OF CORRECTION

PATENT NO.   :   5,105,383
DATED        :   April 14, 1992
INVENTOR(S)  :   FUMIHIKO SAITO ET AL.

It is certified that error appears in the above-identified patent and that said Letters Patent is hereby corrected as shown below:

<u>COLUMN 9</u>

Line 46, "means," should be deleted.

Signed and Sealed this

Seventeenth Day of August, 1993

Attest:

BRUCE LEHMAN

Attesting Officer        Commissioner of Patents and Trademarks